(12) United States Patent
Kim et al.

(10) Patent No.: US 11,532,799 B2
(45) Date of Patent: Dec. 20, 2022

(54) NEURON BEHAVIOR-IMITATING ELECTRONIC SYNAPSE DEVICE AND METHOD OF FABRICATING THE SAME

(71) Applicant: IUCF-HYU (Industry-University Cooperation Foundation Hanyang University), Seoul (KR)

(72) Inventors: Tae Whan Kim, Seoul (KR); Young Pyo Jeon, Seoul (KR); Jeong Heon Lee, Seoul (KR)

(73) Assignee: IUCF-HYU (INDUSTRY-UNIVERSITY COOPERATION FOUNDATION HANYANG UNIVERSITY), Seoul (KR)

( * ) Notice: Subject to any disclaimer, the term of this patent is extended or adjusted under 35 U.S.C. 154(b) by 142 days.

(21) Appl. No.: 17/075,937

(22) Filed: Oct. 21, 2020

(65) Prior Publication Data
US 2021/0119159 A1    Apr. 22, 2021

(30) Foreign Application Priority Data

Oct. 22, 2019 (KR) .................. 10-2019-0131745
Sep. 11, 2020 (KR) .................. 10-2020-0117070

(51) Int. Cl.
*H01L 51/05* (2006.01)
*H01L 51/00* (2006.01)
*G06N 3/063* (2006.01)
*H01L 51/10* (2006.01)

(52) U.S. Cl.
CPC ......... *H01L 51/0591* (2013.01); *G06N 3/063* (2013.01); *H01L 51/0021* (2013.01); *H01L 51/102* (2013.01)

(58) Field of Classification Search
CPC ............ H01L 51/0591; H01L 51/0021; H01L 51/102; G06N 3/063
See application file for complete search history.

(56) References Cited

U.S. PATENT DOCUMENTS 10,467,524 B1 * 11/2019 Todorov ............... H01L 45/085
2007/0064175 A1 * 3/2007 Kim ..................... H01L 45/1608
                                                            349/86

(Continued)

FOREIGN PATENT DOCUMENTS

KR    10-2007-0032500 A    3/2007
KR    10-2013-0127078 A    11/2013

(Continued)

OTHER PUBLICATIONS

Office Action dated Sep. 30, 2021 in Korean Application No. 10-2020-0117070.

*Primary Examiner* — David Vu
*Assistant Examiner* — Brandon C Fox
(74) *Attorney, Agent, or Firm* — Sughrue Mion, PLLC

(57) ABSTRACT

The present disclosure relates to a neuron behavior-imitating electronic synapse device and a method of fabricating the same. According to one embodiment, the neuron behavior-imitating synapse device includes a first electrode having a lithium-doped surface, an active layer formed on the first electrode and including a polyelectrolyte and one or more metal nanoparticles, and a second electrode formed on the active layer.

7 Claims, 9 Drawing Sheets

(56) References Cited

U.S. PATENT DOCUMENTS

2014/0264224 A1\* 9/2014 Zhang ................... H01L 45/145
257/2
2020/0335693 A1\* 10/2020 Lee ..................... H01L 45/1253
2021/0012974 A1\* 1/2021 Zhou ...................... H01G 9/028

FOREIGN PATENT DOCUMENTS

| KR | 2013-0127078 | \* 11/2013 | ............ H01L 27/115 |
| KR | 10-2014-0088369 A | 7/2014 | |
| KR | 10-2016-0030453 A | 3/2016 | |
| KR | 10-2019-0062819 A | 6/2019 | |

\* cited by examiner

[FIG. 1]
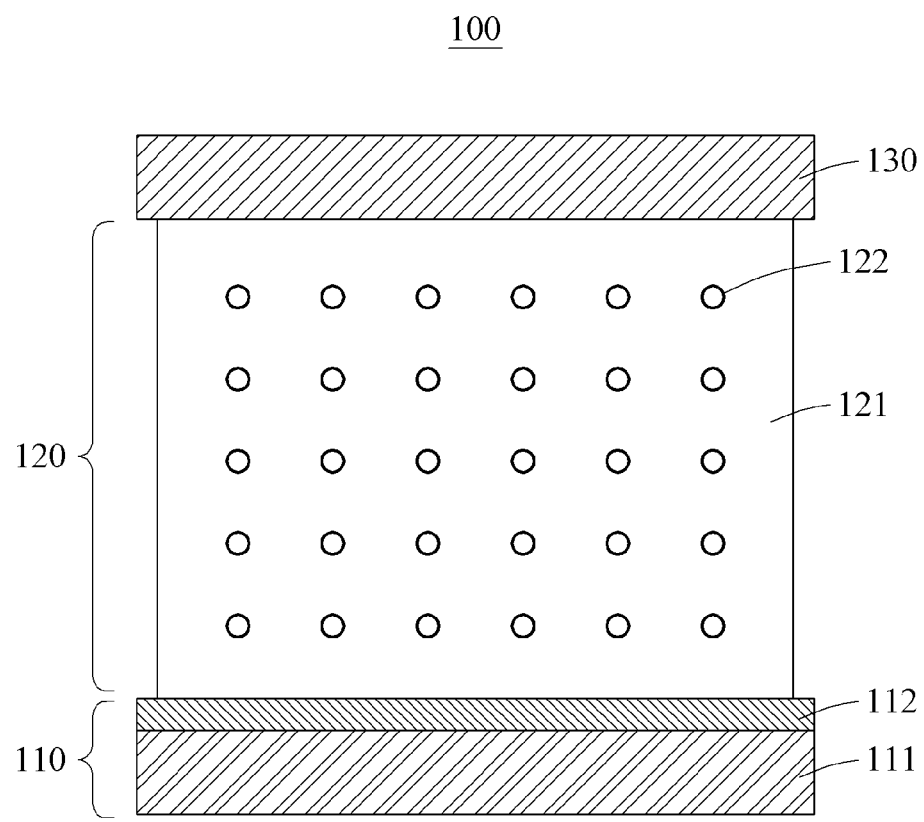

【FIG. 2A】
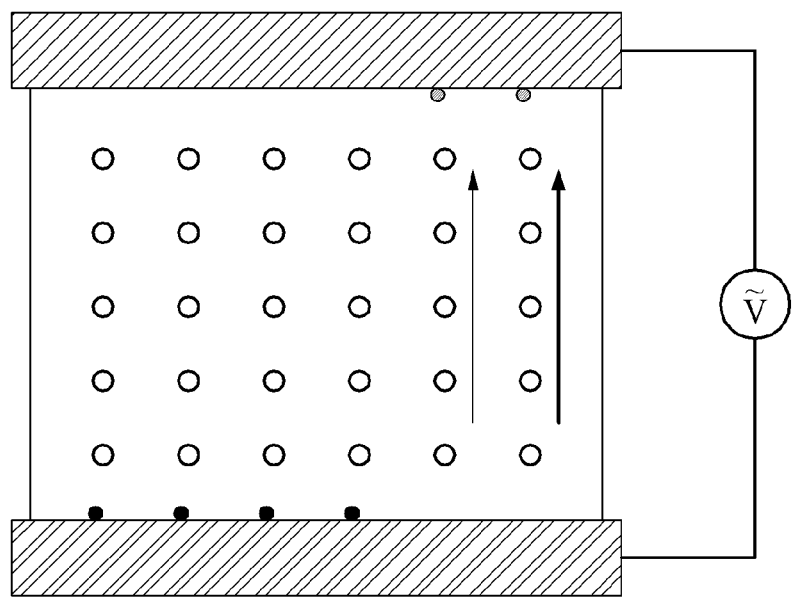
【FIG. 2B】
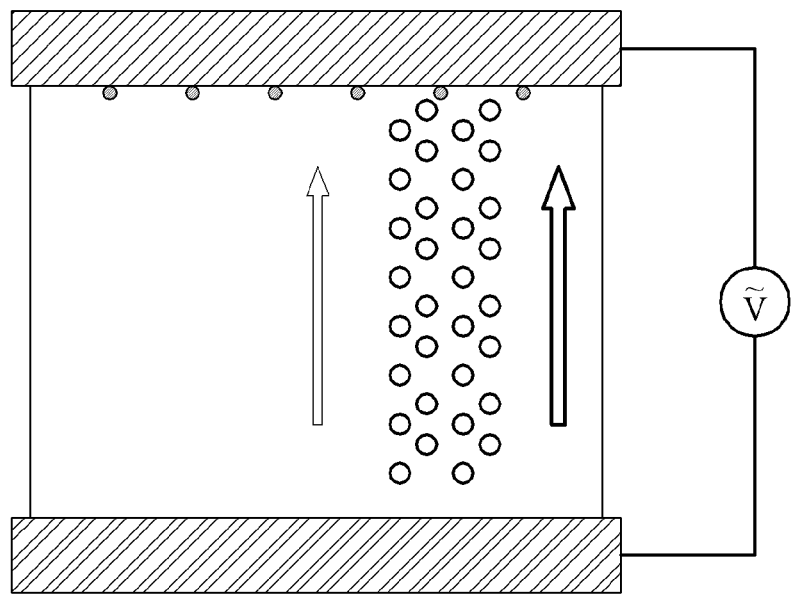

[FIG. 3A]
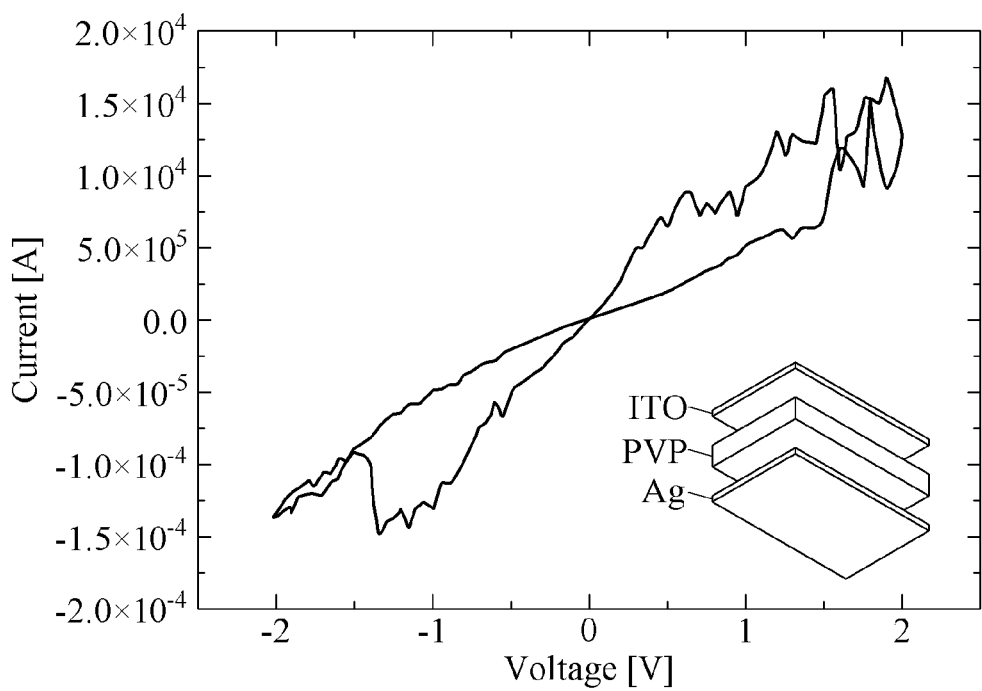
[FIG. 3B]
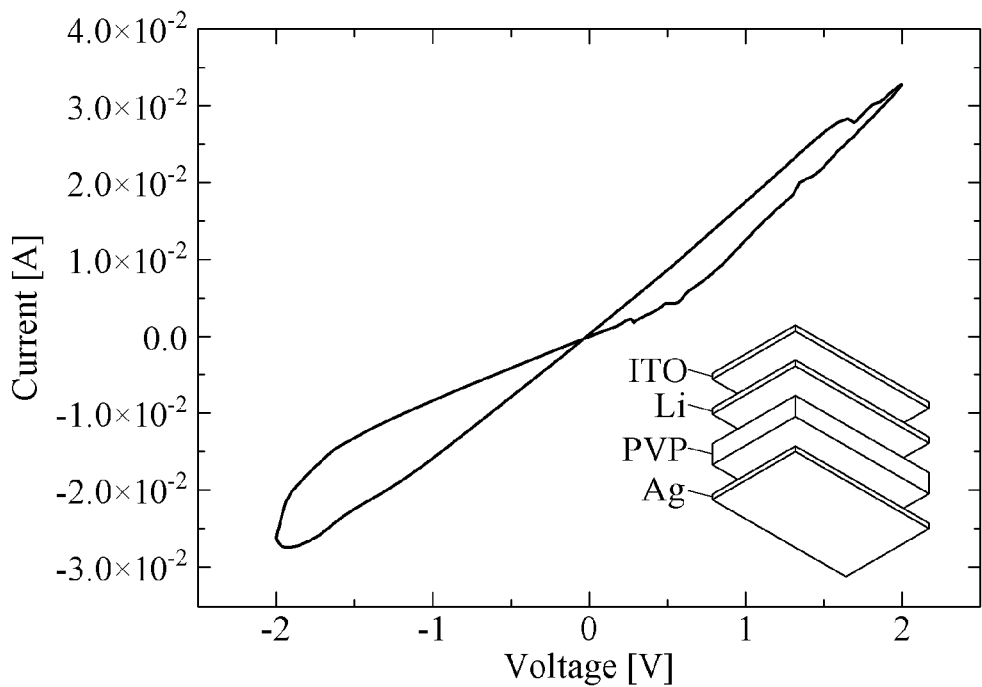

[FIG. 4A]
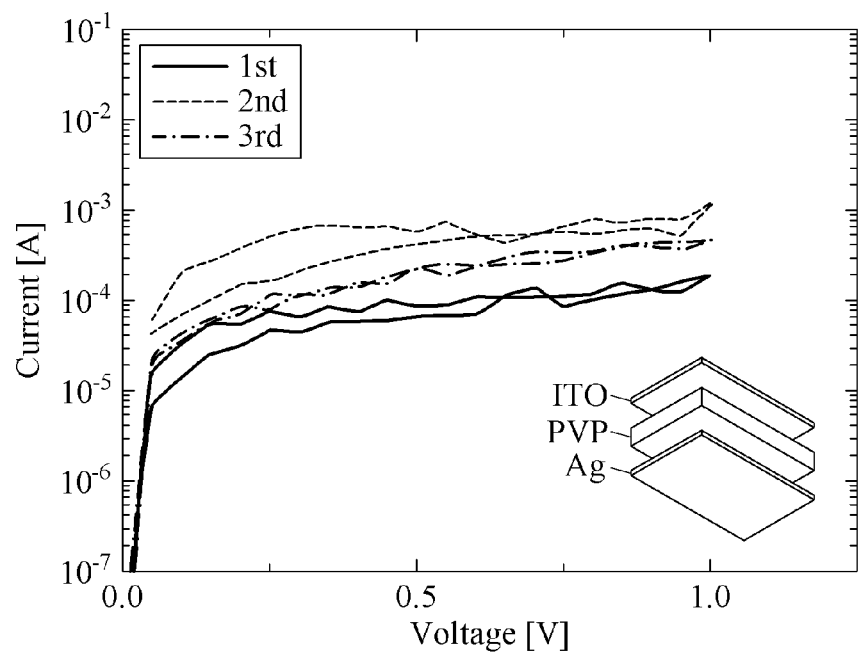
[FIG. 4B]
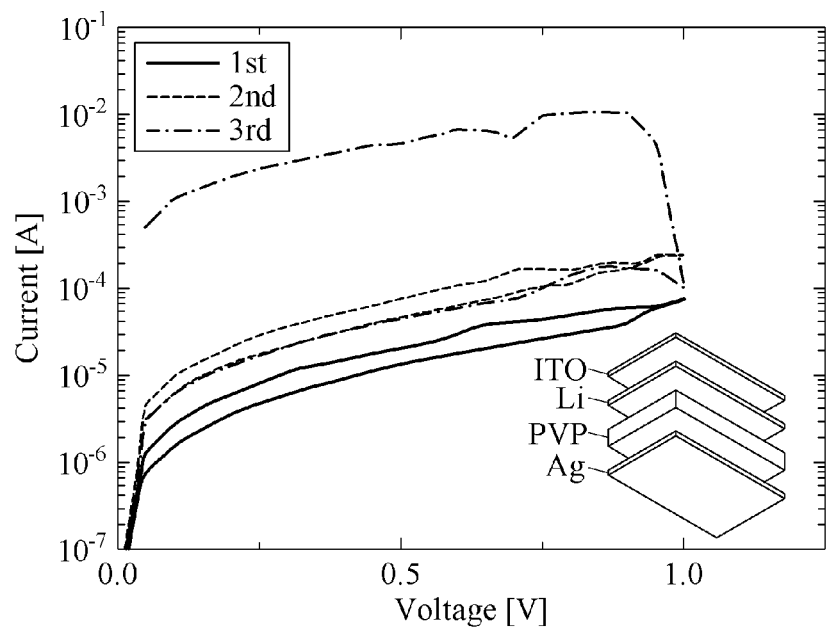

[FIG. 5A]
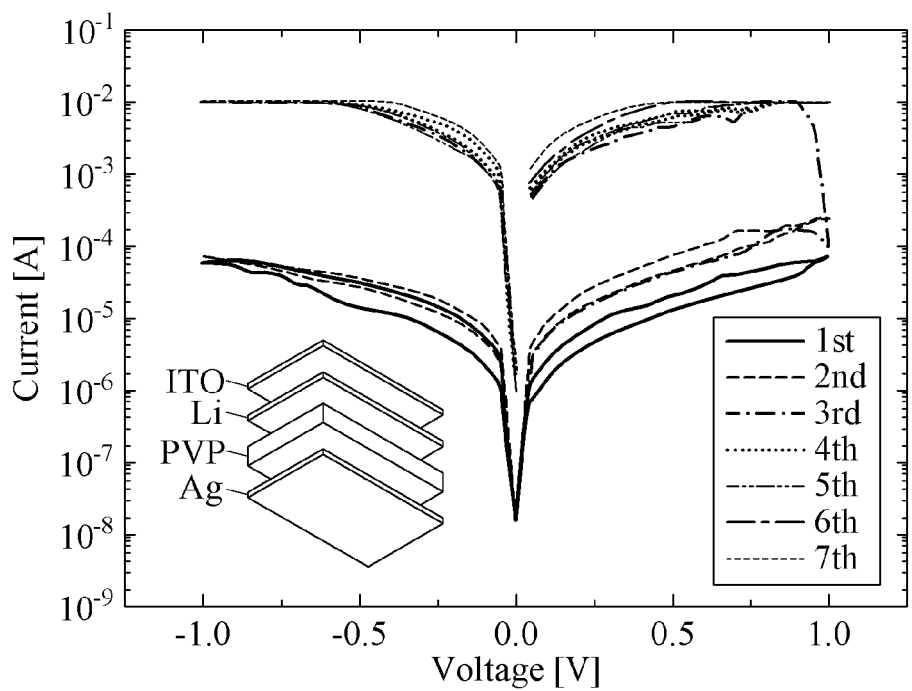
[FIG. 5B]
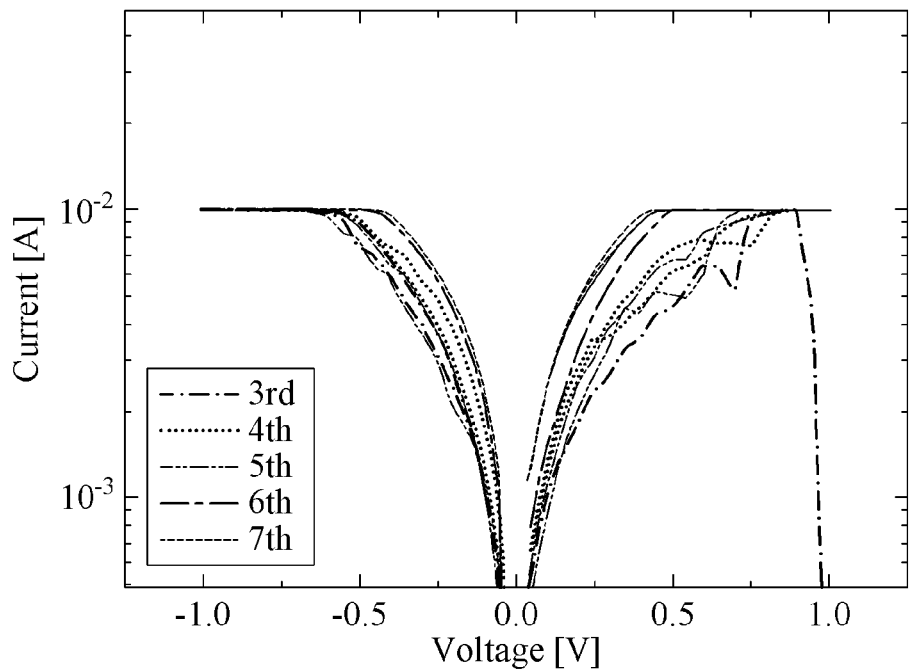

【FIG. 6】
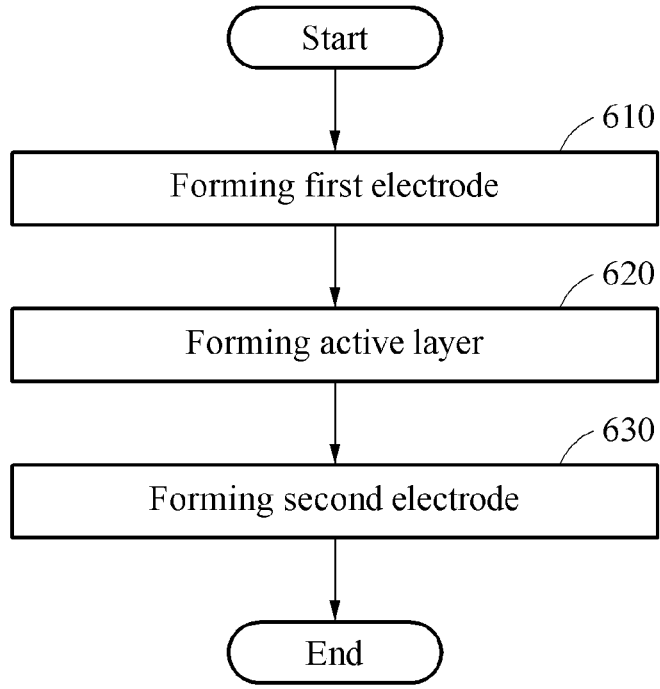
【FIG. 7A】
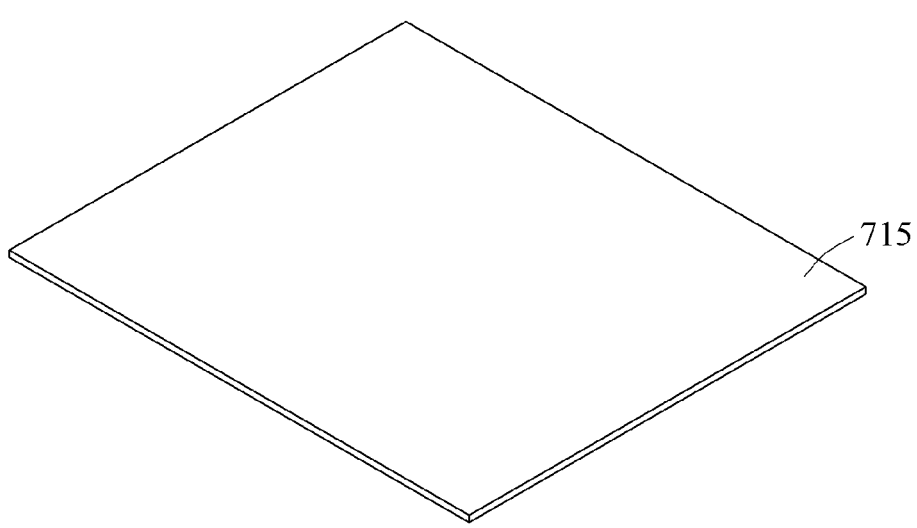

[FIG. 7B]
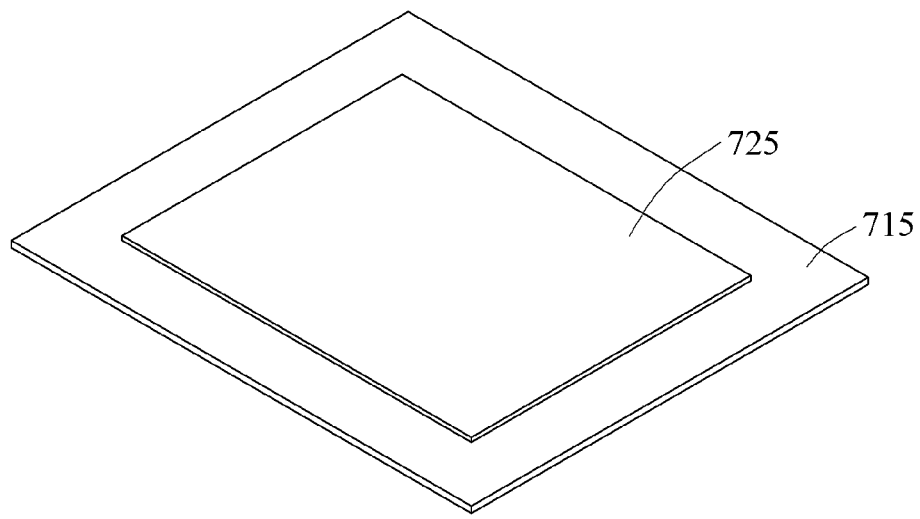
[FIG. 7C]
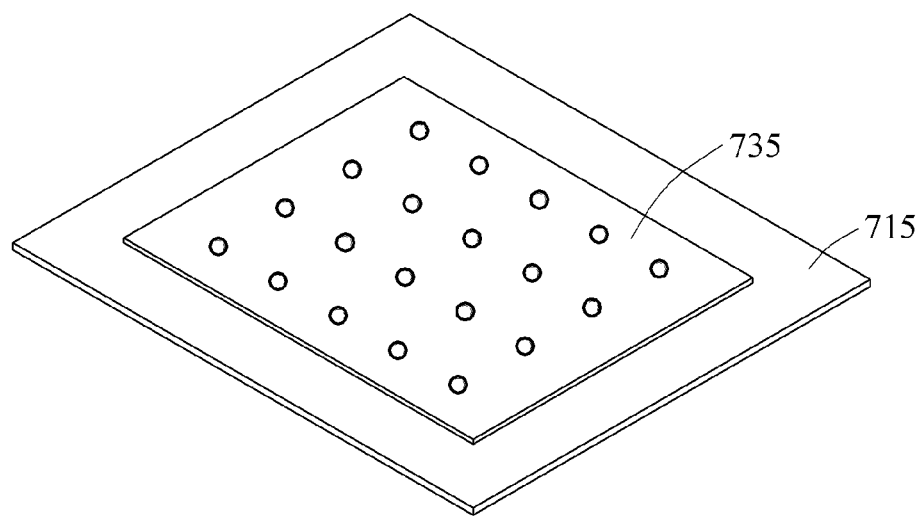

【FIG. 7D】
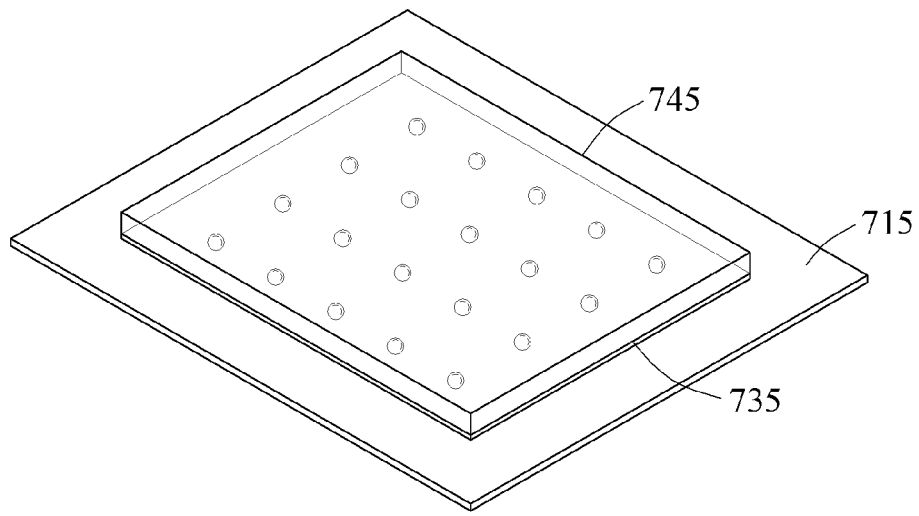
【FIG. 7E】
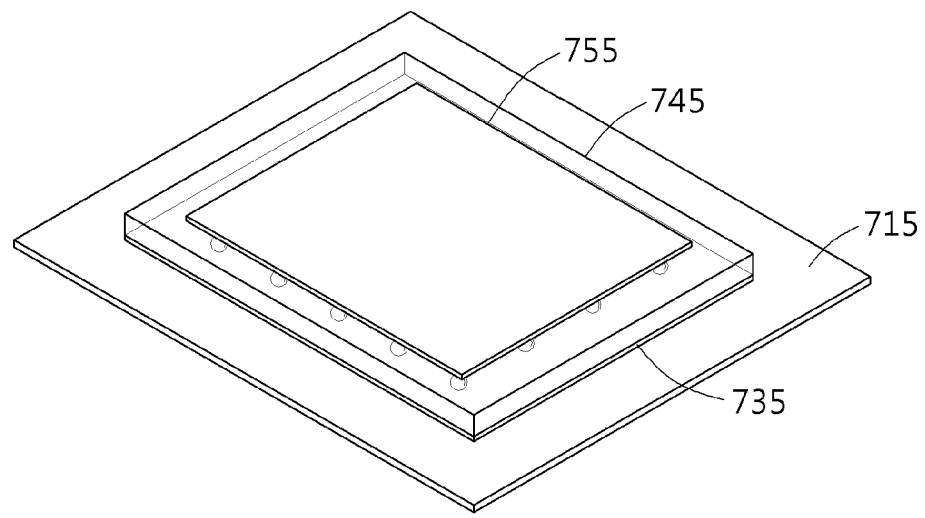

[FIG. 8]
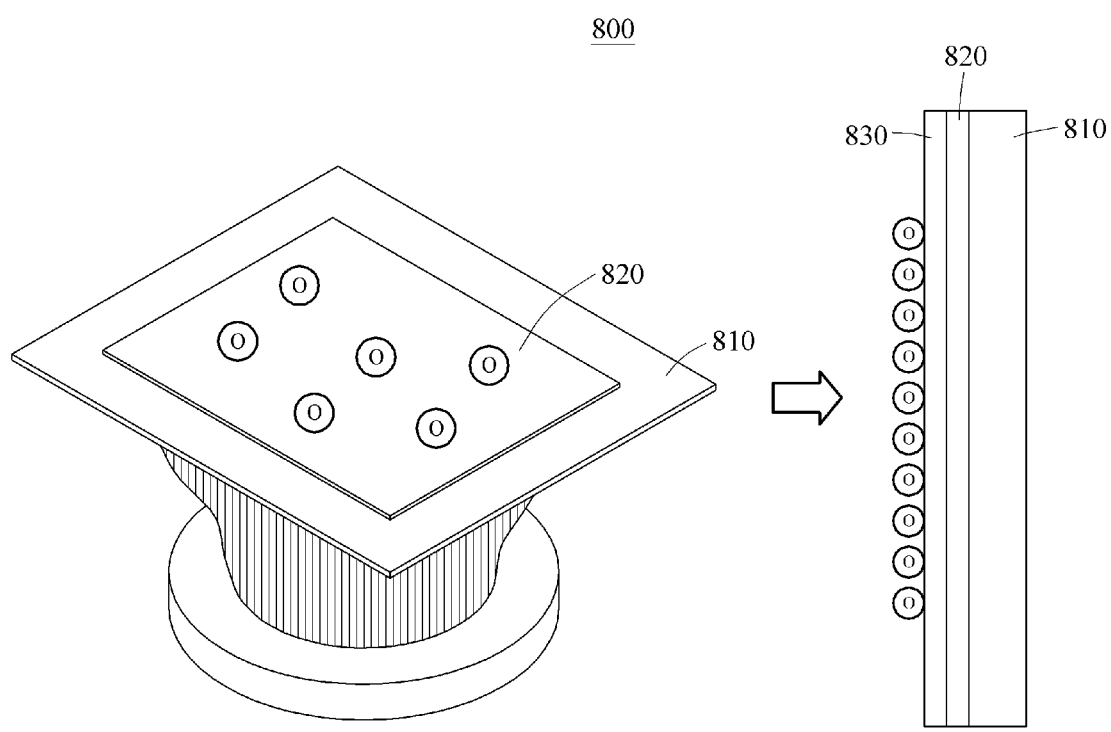

NEURON BEHAVIOR-IMITATING ELECTRONIC SYNAPSE DEVICE AND METHOD OF FABRICATING THE SAME

CROSS-REFERENCE TO RELATED APPLICATIONS

This application claims priority to Korean Patent Application No. 10-2019-0131745, filed on Oct. 22, 2019, and Korean Patent Application No. 10-2020-0117070, filed on Sep. 11, 2020, in the Korean Intellectual Property Office, the disclosures of each of which are incorporated herein by reference.

BACKGROUND OF THE DISCLOSURE

Field of the Disclosure

The present disclosure relates to a neuron behavior-imitating synapse device, and more particularly, to a synapse device that may solve difficulty in switching from short-term memory to long-term memory.

Description of the Related Art

As a neuromorphic device based on a nonvolatile memory, positive electrode resistive memory devices having a simple structure, high-density integration characteristics, and high-speed operation characteristics are attracting attention.

The resistive memory device refers to a device having two or more conductive states. In the resistive memory device, a high conductivity state (low resistance state) and a low conductivity state (high resistance state) can be switched according to applied voltages. Due to these properties, the resistive memory device can be employed in the field of rewritable nonvolatile memory.

An important issue in the study of resistive memory devices is implementing long duration, fast response, and a high on/off ratio. According to the resistive memory mechanism based on filament theory, a high on/off ratio and long duration can be implemented based on change in a state including formation and rupture of a metal filament.

Resistive memory devices using silver (Ag) or gold (Au) nanoparticles form filaments through accumulation of silver or gold nanoparticles. Accordingly, the resistive memory devices exhibit a large change in resistance, and implement learning and a memory state, which is a function of imitating neuron behaviors, based on change in the maximum current of a high conductivity state in the formation process.

According to conventional resistive memory-based synapse devices, a method of performing phase transition between high and low conductivity states using silver or gold nanoparticles is used to implement synaptic reinforcement and suppression based on change in current during a filament formation process. Accordingly, the conventional devices have a problem in that the magnitude of current change due to reinforcement and suppression phenomena is small.

In addition, in the case of using a large amount of metal nanoparticles to solve this problem, there is a problem in that a device reacts too sensitively because the interval between the phase change voltages of high conductivity and low conductivity is small.

RELATED ART DOCUMENTS

Patent Documents

Korean Patent Application Publication No. 10-2019-0062819, "RESISTANCE CHANGE MEMORY DEVICE AND METHOD OF OPERATING THE SAME"

SUMMARY OF THE DISCLOSURE

Therefore, the present disclosure has been made in view of the above problems, and it is an object of the present disclosure to provide a neuron behavior-imitating synapse device capable of improving switching characteristics between short-term memory and long-term memory and the margin of output current according to input voltages in a reinforcement-suppression process based on filament theory and a method of fabricating the neuron behavior-imitating synapse device.

It is another object of the present disclosure to provide a neuron behavior-imitating synapse device capable of effectively implementing reinforcement and suppression of synaptic behavior characteristics by causing a resistance change in a device through a state change between high conductivity and low conductivity and a chemical oxidation-reduction reaction of lithium and a method fabricating the neuron behavior-imitating synapse device.

In accordance with one aspect of the present disclosure, provided is a neuron behavior-imitating synapse device including a first electrode having a lithium-doped surface; an active layer formed on the first electrode and including a polyelectrolyte and one or more metal nanoparticles; and a second electrode formed on the active layer.

According to one aspect of the present disclosure, the first electrode may consist of an electrode material and a lithium oxide layer, wherein the lithium oxide layer is formed on the electrode material through surface treatment.

According to one aspect of the present disclosure, a resistance of the active layer may vary due to a change in a work function of at least one of the first and second electrodes by oxidation-reduction reaction in the lithium oxide layer.

According to one aspect of the present disclosure, a resistance of the active layer may vary depending on whether a metal filament based on the metal nanoparticles is formed or not.

According to one aspect of the present disclosure, the polyelectrolyte may include at least one of polyvinylpyrrolidone (PVP), polyethylene glycol (PEO), polyethyleneimine (PEI), polyethylene sulfide (PES), polyvinyl acetate (PVAc), and poly(ethylene succinate) (PESc).

According to one aspect of the present disclosure, the metal nanoparticles may include at least one of platinum (Pt), palladium (Pd), silver (Ag), and gold (Au).

According to one aspect of the present disclosure, the metal nanoparticles may be formed in at least one of a tetrahexahedron, a hexoctahedron, and a trisoctahedron and may have a diameter of 2 nm to 20 nm.

In accordance with another aspect of the present disclosure, provided is a method of fabricating a neuron behavior-imitating synapse device, the method including forming a first electrode having a lithium-doped surface; forming an active layer formed on the first electrode and including a polyelectrolyte and one or more metal nanoparticles; and forming a second electrode formed on the active layer.

According to one aspect of the present disclosure, the first electrode may consist of an electrode material and a lithium oxide layer, wherein the lithium oxide layer is formed on the electrode material through surface treatment.

According to one aspect of the present disclosure, the forming of the first electrode may further include applying a lithium quinolate (Liq) layer onto an electrode material; and forming a lithium oxide layer on a surface of the lithium quinolate layer by heat-treating the lithium quinolate layer.

According to one aspect of the present disclosure, a resistance of the active layer may vary due to a change in a work function of at least one of the first and second electrodes by oxidation-reduction reaction in the lithium oxide layer.

According to one aspect of the present disclosure, a resistance of the active layer may vary depending on whether a metal filament based on the metal nanoparticles is formed or not.

BRIEF DESCRIPTION OF THE DRAWINGS

The above and other objects, features and other advantages of the present disclosure will be more clearly understood from the following detailed description taken in conjunction with the accompanying drawings, in which:

FIG. 1 illustrates a synapse device according to one embodiment;

FIGS. 2A to 2B includes drawings for explaining an example of driving a synapse device according to one embodiment;

FIGS. 3A to 3B includes graphs for comparing current-voltage characteristics between a synapse device according to one embodiment and a conventional synapse device;

FIGS. 4A to 4B includes graphs for comparing current change characteristics according to the number of voltage swings between a synapse device according to one embodiment and a conventional synapse device;

FIGS. 5A to 5B includes graphs for explaining current change characteristics according to the number of voltage swings in a synapse device according to one embodiment;

FIG. 6 is a flowchart for explaining a method of fabricating a synapse device according to one embodiment;

FIGS. 7A to 7E are drawings for explaining an example for a method of fabricating a synapse device according to one embodiment; and FIG. 8 is a drawing for explaining an example of forming a lithium oxide layer in a method of fabricating a synapse device according to one embodiment.

DETAILED DESCRIPTION OF THE DISCLOSURE

Hereinafter, the embodiments of the present disclosure will be described in detail with reference to the drawings.

However, it should be understood that the present disclosure is not limited to the embodiments according to the concept of the present disclosure, but includes changes, equivalents, or alternatives falling within the spirit and scope of the present disclosure.

In the following description of the present disclosure, a detailed description of known functions and configurations incorporated herein will be omitted when it may make the subject matter of the present disclosure unclear.

In addition, the terms used in the specification are defined in consideration of functions used in the present disclosure, and can be changed according to the intent or conventionally used methods of clients, operators, and users. Accordingly, definitions of the terms should be understood on the basis of the entire description of the present specification.

In description of the drawings, like reference numerals may be used for similar elements.

The singular expressions in the present specification may encompass plural expressions unless clearly specified otherwise in context.

In this specification, expressions such as "A or B" and "at least one of A and/or B" may include all possible combinations of the items listed together.

Expressions such as "first" and "second" may be used to qualify the elements irrespective of order or importance, and are used to distinguish one element from another and do not limit the elements.

It will be understood that when an element (e.g., first) is referred to as being "connected to" or "coupled to" another element (e.g., second), it may be directly connected or coupled to the other element or an intervening element (e.g., third) may be present.

As used herein, "configured to" may be used interchangeably with, for example, "suitable for", "ability to", "changed to", "made to", "capable of", or "designed to" in terms of hardware or software.

In some situations, the expression "device configured to" may mean that the device "may do ~" with other devices or components.

For example, in the sentence "processor configured to perform A, B, and C", the processor may refer to a general purpose processor (e.g., CPU or application processor) capable of performing corresponding operation by running a dedicated processor (e.g., embedded processor) for performing the corresponding operation, or one or more software programs stored in a memory device.

In addition, the expression "or" means "inclusive or" rather than "exclusive or".

That is, unless otherwise mentioned or clearly inferred from context, the expression "x uses a or b" means any one of natural inclusive permutations.

In the above-described specific embodiments, elements included in the invention are expressed singular or plural in accordance with the specific embodiments shown.

It should be understood, however, that the singular or plural representations are to be chosen as appropriate to the situation presented for the purpose of description and that the above-described embodiments are not limited to the singular or plural constituent elements. The constituent elements expressed in plural may be composed of a single number, and constituent elements expressed in singular form may be composed of a plurality of elements.

In addition, the present disclosure has been described with reference to exemplary embodiments, but it should be understood that various modifications may be made without departing from the scope of the present disclosure.

Therefore, the scope of the present disclosure should not be limited by the embodiments, but should be determined by the following claims and equivalents to the following claims.

FIG. 1 illustrates a synapse device according to one embodiment.

Referring to FIG. 1, to solve the disadvantages of a conventional synapse device, such as difficulty in switching between short-term memory and long-term memory in a reinforcement-suppression process based on filament theory and lowering of the margin of output current according to input voltages, a synapse device 100 according to one embodiment may greatly change the resistance of the device through oxidation-reduction of lithium by adding a polyelectrolyte and lithium, thereby improving an effect of imitating short-term memory and long-term memory and effectively switching the resistance state of the device.

Specifically, the synapse device 100 according to one embodiment may be implemented as a structure in which the reinforcement and suppression process of a neuromorphic device occurs more effectively by lithium transfer in high conductivity of a resistive memory by allowing metal nanoparticle filaments and lithium to be transferred at the same time by doping the surface of an electrode with lithium and using a polyelectrolyte as a medium using metal nanoparticles.

For this purpose, the synapse device 100 according to one embodiment may include a first electrode 110, an active layer 120, and a second electrode 130.

The surface of the first electrode 110 according to one embodiment may be doped with lithium.

According to one aspect of the present disclosure, the first electrode 110 may be an electrode consisting of an electrode material 111 and a lithium oxide layer 112, wherein the lithium oxide layer 112 is formed on the electrode material 111 through surface treatment.

For example, the electrode material 111 of the first electrode 110 may include at least one of indium tin oxide (ITO), Al-doped ZnO (AZO), Ga-doped ZnO (GZO), In- and Ga-doped ZnO (IGZO), Mg-doped ZnO (MZO), Al-doped MgO, Ga-doped MgO, F-doped $SnO_2$, Nb-doped $TiO_2$, copper-aluminum oxide ($CuAlO_2$), graphene, discrete carbon nanotubes (dCNT), multi-walled carbon nanotubes (mCNT), carbon nanotubes (CNT), graphene oxide, and buckminsterfullerene ($C_{60}$).

In addition, the electrode material 111 of the first electrode 110 may be implemented as at least one multilayer structure of $CuAlO_2$/Ag/$CuAlO_2$, ITO/Ag/ITO, ZnO/Ag/ZnO, ZnS/Ag/ZnS, $TiO_2$/Ag/$TiO_2$, ITO/Au/ITO, $WO_3$/Ag/$WO_3$, and $MoO_3$/Ag/$MoO_3$.

The lithium oxide layer 112 may be formed by applying a lithium quinolate (Liq) layer on the surface of the electrode material 111 of the first electrode 110 and heat-treating the applied lithium quinolate layer at a preset temperature.

The active layer 120 according to one embodiment may be formed on the first electrode 110 and may include a polyelectrolyte 121 and one or more metal nanoparticles 122.

For example, the polyelectrolyte may include at least one of polyvinylpyrrolidone (PVP), polyethylene glycol (PEO), polyethyleneimine (PEI), polyethylene sulfide (PES), polyvinyl acetate (PVAc), and poly(ethylene succinate) (PESc).

In addition, the polyelectrolyte 121 may include at least one highly conductive membrane of a poly($\alpha,\beta,\beta$-trifluorostyrene) membrane, a sulfonated polyvinyl fluoride membrane, a graft ionomer membrane, and a perfluorinated sulfonimide ionomer membrane.

According to one aspect of the present disclosure, the metal nanoparticles 122 may include at least one of platinum (Pt), palladium (Pd), silver (Ag), and gold (Au).

According to one aspect of the present disclosure, the metal nanoparticles 122 may be implemented as at least one form of a tetrahexahedron, a hexoctahedron, and a trisoctahedron. In addition, the metal nanoparticles 122 may be formed to have a diameter of 2 nm to 20 nm.

According to one aspect of the present disclosure, the resistance of the active layer 120 may vary due to a change in the work function of at least one of the first and second electrodes 110 and 130 by oxidation-reduction reaction in the lithium oxide layer 112.

In addition, the resistance of the active layer 120 may vary depending on whether a metal filament based on the metal nanoparticles 122 is formed or not.

That is, due to the presence of the active layer 120, in addition to a state change between a high conductivity state and a low conductivity state according to an input voltage applied through the first and second electrodes 110 and 130, the work functions of the electrodes may be changed through chemical oxidation-reduction of lithium according to the input voltage, causing a resistance change in a device. Thereby, effective reinforcement and suppression of synaptic behavior characteristics may be implemented.

Specifically, the synapse device 100 may use lithium ions to solve difficulties in implementing short-term memory and long-term memory phenomena that occurs when synapses are implemented through a filament phenomenon.

That is, the synapse device 100 may clearly distinguish imitation of short-term memory reinforcement through transition of lithium ions in a low conductivity state and may clearly distinguish imitation of long-term memory reinforcement through transition of lithium ions in a high conductivity state. In addition, in the synapse device 100, since lithium ions transition to the opposite electrode in a negative voltage state, the magnitude of change in a suppression state may also be controlled to be large.

The second electrode 130 according to one embodiment may be formed on the active layer 120. For example, the second electrode 130 may include at least one electrode material of aluminum (Al), gold (Au), silver (Ag), copper (Cu), platinum (Pt), tungsten (W), nickel (Ni), zinc (Zn), titanium (Ti), zirconium (Zr), hydrogen fluoride (Hf), cadmium (Cd), and palladium (Pd).

In addition, the electrode material of the second electrode 130 may be implemented as at least one multilayer structure of $CuAlO_2$/Ag/$CuAlO_2$, ITO/Ag/ITO, ZnO/Ag/ZnO, ZnS/Ag/ZnS, $TiO_2$/Ag/$TiO_2$, ITO/Au/ITO, $WO_3$/Ag/$WO_3$, and $MoO_3$/Ag/$MoO_3$.

In addition, the surface of at least one of the first and second electrodes 110 and 130 may be coated with a blocking layer having a predetermined thickness to prevent occurrence of short-circuit between electrodes.

For example, the surface of at least one of the first and second electrodes 110 and 130 may be spin-coated with nanoparticles such as silica, alumina, and titania to form the blocking layer.

FIGS. 2A to 2B includes drawings for explaining an example of driving a synapse device according to one embodiment.

Referring to FIGS. 2A to 2B, FIG. 2A illustrates a synapse device in a low conductivity state (off state), and FIG. 2B illustrates a synapse device in a high conductivity state (on state).

Referring to FIG. 2A, in the synapse device according to one embodiment, when a preset first input voltage is applied through the first and second electrodes, high device resistance results in a low conductivity state, and a small amount of current may flow through the active layer.

In this case, in the synapse device, additional first current may be generated due to transition of some lithium ions due to oxidation of lithium. Thereby, the magnitude of change in a suppression phenomenon may be controlled to be large.

Referring to FIG. 2B, in the synapse device according to one embodiment, when a preset second input voltage is applied through the first and second electrodes, a filament based on metal nanoparticles is formed in the active layer to reduce the resistance of the device. That is, the synapse device may be in a high conductivity state due to low device resistance.

In this case, in the synapse device, due to transition of many lithium ions due to oxidation of lithium, additional second current having a larger magnitude than the first current may be generated. Thereby, a reinforcement phenomenon may be further strengthened.

That is, the synapse device according to one embodiment may effectively implement the reinforcement and suppression phenomena of a device through oxidation-reduction of lithium by adding a polyelectrolyte and lithium.

FIGS. 3A to 3B includes graphs for comparing current-voltage characteristics between a synapse device according to one embodiment and a conventional synapse device.

Referring to FIGS. 3A to 3B, FIG. 3A shows the current-voltage characteristics of a conventional synapse device composed of an ITO electrode (a first electrode), PVP (a conductive polymer), and a silver electrode (a second electrode), and FIG. 3B shows the current-voltage characteristics of a synapse device according to one embodiment composed of a lithium-doped ITO electrode (a first electrode), PVP (a conductive polymer), and a silver electrode (a second electrode).

Referring to FIGS. 3A to 3B, it can be confirmed that, considering the pattern of changes in current depending on voltages, the synapse device according to one embodiment including a lithium-doped ITO electrode exhibits a linear pattern compared to the conventional synapse device and the synapse device according to one embodiment has a large current value.

FIGS. 4A to 4B includes graphs for comparing current change characteristics according to the number of voltage swings between a synapse device according to one embodiment and a conventional synapse device.

Referring to FIGS. 4A to 4B, FIG. 4A shows the current change characteristics of a conventional synapse device composed of an ITO electrode (a first electrode), PVP (a conductive polymer), and a silver electrode (a second electrode) according to the number of voltage swings, and FIG. 4B shows the current change characteristics of a synapse device according to one embodiment composed of a lithium-doped ITO electrode (a first electrode), PVP (a conductive polymer), and a silver electrode (a second electrode) according to the number of voltage swings.

As shown in FIGS. 4A to 4B, unlike the conventional synapse device, it can be confirmed that, when the synapse device according to one embodiment is repeatedly driven at voltages of 0V, 1V, and −1V, the range of a device resistance change is large. Based on this, the effect of diffusion of lithium ions can be observed.

FIGS. 5A to 5B includes graphs for explaining current change characteristics according to the number of voltage swings in a synapse device according to one embodiment.

Referring to FIGS. 5A to 5B, FIG. 5A shows the current change characteristics of a synapse device according to one embodiment according to the number of voltage swings (1st to 7th), and FIG. 5B shows an enlarged view of the graph area corresponding to 3rd to 7th in FIG. 5A.

As shown in FIGS. 5A to 5B, it can be confirmed that the synapse device according to one embodiment exhibits a current reinforcement phenomenon due to diffusion of lithium ions even when transitioning from a high resistance state (HRS) to a low resistance state (LRS).

That is, compared to the conventional synapse device, the synapse device according to one embodiment exhibits a distinct current reinforcement phenomenon. Based on this result, it can be seen that, compared to the conventional synapse device, the synapse device according to one embodiment may effectively implement the plasticity of a synapse by adding a lithium-doped electrode having a simple structure.

FIG. 6 is a flowchart for explaining a method of fabricating a synapse device according to one embodiment.

That is, FIG. 6 is a flowchart for explaining a method of fabricating a synapse device according to one embodiment that has been described with reference to FIGS. 1 to 5, and thus repeated description thereof will be omitted.

Referring to FIG. 6, in step 610 of the method of fabricating a synapse device according to one embodiment, a first electrode having a lithium-doped surface may be formed.

According to one aspect of the present disclosure, the first electrode may be an electrode consisting of an electrode material and a lithium oxide layer, wherein the lithium oxide layer is formed on the electrode material through surface treatment.

For example, the electrode material of the first electrode may include at least one of indium tin oxide (ITO), Al-doped ZnO (AZO), Ga-doped ZnO (GZO), In- and Ga-doped ZnO (IGZO), Mg-doped ZnO (MZO), Al-doped MgO, Ga-doped MgO, F-doped $SnO_2$, Nb-doped $TiO_2$, copper-aluminum oxide ($CuAlO_2$), graphene, discrete carbon nanotubes (dCNT), multi-walled carbon nanotubes (mCNT), carbon nanotubes (CNT), graphene oxide, and buckminsterfullerene ($C_{60}$).

In addition, the electrode material of the first electrode may be implemented as at least one multilayer structure of $CuAlO_2/Ag/CuAlO_2$, ITO/Ag/ITO, ZnO/Ag/ZnO, ZnS/Ag/ZnS, $TiO_2/Ag/TiO_2$, ITO/Au/ITO, $WO_3/Ag/WO_3$, and $MoO_3/Ag/MoO_3$.

Next, in step 620 of the method of fabricating a synapse device according to one embodiment, an active layer including a polyelectrolyte and one or more metal nanoparticles may be formed on the first electrode.

For example, the polyelectrolyte may include at least one of polyvinylpyrrolidone (PVP), polyethylene glycol (PEO), polyethyleneimine (PEI), polyethylene sulfide (PES), polyvinyl acetate (PVAc), and poly(ethylene succinate) (PESc).

In addition, the metal nanoparticles may include at least one of platinum (Pt), palladium (Pd), silver (Ag), and gold (Au).

The metal nanoparticles may be formed in at least one of a tetrahexahedron, a hexoctahedron, and a trisoctahedron. In addition, the metal nanoparticles may have a diameter of 2 nm to 20 nm.

Next, in step 630 of the method of fabricating a synapse device according to one embodiment, a second electrode may be formed on the active layer.

For example, the second electrode may include at least one electrode material of aluminum (Al), gold (Au), silver (Ag), copper (Cu), platinum (Pt), tungsten (W), nickel (Ni), zinc (Zn), titanium (Ti), zirconium (Zr), hydrogen fluoride (Hf), cadmium (Cd), and palladium (Pd).

In addition, the electrode material of the second electrode 130 may be implemented as at least one multilayer structure of $CuAlO_2/Ag/CuAlO_2$, ITO/Ag/ITO, ZnO/Ag/ZnO, ZnS/Ag/ZnS, $TiO_2/Ag/TiO_2$, ITO/Au/ITO, $WO_3/Ag/WO_3$, and $MoO_3/Ag/MoO_3$.

According to one aspect of the present disclosure, the resistance of the active layer may vary due to a change in the work function of any one of the first and second electrodes by oxidation-reduction reaction in the lithium oxide layer. In addition, the resistance of the active layer may vary depending on whether a metal filament based on the metal nanoparticles is formed or not.

Specifically, the synapse device according to one embodiment may use lithium ions to solve difficulties in implementing short-term memory and long-term memory phenomena that occur when synapses are implemented through a filament phenomenon.

That is, the synapse device may clearly distinguish imitation of short-term memory reinforcement through transition of lithium ions in a low conductivity state and may clearly distinguish imitation of long-term memory reinforcement through transition of lithium ions in a high conductivity state. In addition, in the synapse device, since lithium ions transition to the opposite electrode in a negative voltage state, the magnitude of change in a suppression state may also be controlled to be large.

The method of fabricating a synapse device according to one embodiment will be described in more detail with reference to FIGS. 7A to 7E.

FIGS. 7A to 7E are drawings for explaining an example for a method of fabricating a synapse device according to one embodiment.

Referring to FIGS. 7A to 7E, in step 710 of the method of fabricating a synapse device according to one embodiment, an electrode material 715 of the first electrode may be formed.

For example, the electrode material 715 of the first electrode may be indium tin oxide (ITO) formed on a glass substrate.

According to one aspect of the present disclosure, in step 710 of the method of fabricating a synapse device according to one embodiment, the glass substrate on which the ITO material has been formed may be subjected to pretreatment processes including cleaning, drying, and ultraviolet light (UV) treatment.

For example, the cleaning process may be performed by performing ultrasonic treatment for a preset time while immersing the glass substrate having the ITO material thereon in a solution containing acetone, isopropyl alcohol, and deionized water.

In addition, in the ultraviolet light treatment process, by radiating ultraviolet light having a wavelength of about 200 nm to 700 nm onto the glass substrate on which the ITO material has been formed, contaminants remaining on the surface of the glass substrate may be removed.

In step 720 of the method of fabricating a synapse device according to one embodiment, a lithium quinolate (Liq) layer 725 may be applied onto the electrode material 715.

In step 730 of the method of fabricating a synapse device according to one embodiment, the lithium quinolate layer 725 may be heat-treated at a preset temperature to form a lithium oxide layer 735 on the surface of the lithium quinolate layer 725.

In step 740 of the method of fabricating a synapse device according to one embodiment, an active layer 745 including a polyelectrolyte and one or more metal nanoparticles may be formed on the lithium oxide layer 735.

In step 750 of the method of fabricating a synapse device according to one embodiment, a second electrode 755 may be formed on the active layer 745.

FIG. 8 is a drawing for explaining an example of forming a lithium oxide layer in a method of fabricating a synapse device according to one embodiment.

Referring to FIG. 8, in a method 800 of fabricating a synapse device according to one embodiment, a structure including an electrode material 810 of a first electrode and a lithium quinolate layer 820 formed on the electrode material 810 may be heat-treated at a preset temperature to form a lithium oxide layer 830 on the surface of the lithium quinolate layer 820.

As a result, when the present disclosure is used, switching characteristics between short-term memory and long-term memory and the margin of output current according to input voltages in a reinforcement-suppression process based on filament theory may be improved.

In addition, reinforcement and suppression of synaptic behavior characteristics may be effectively implemented by causing a resistance change in a device through a state change between high conductivity and low conductivity and a chemical oxidation-reduction reaction of lithium.

According to one embodiment of the present disclosure, switching characteristics between short-term memory and long-term memory and the margin of output current according to input voltages in a reinforcement-suppression process based on filament theory can be improved.

According to one embodiment of the present disclosure, the present disclosure can effectively implement reinforcement and suppression of synaptic behavior characteristics by causing a resistance change in a device through a state change between high conductivity and low conductivity and a chemical oxidation-reduction reaction of lithium.

Although the present disclosure has been described with reference to limited embodiments and drawings, it should be understood by those skilled in the art that various changes and modifications may be made therein. For example, the described techniques may be performed in a different order than the described methods, and/or components of the described systems, structures, devices, circuits, etc., may be combined in a manner that is different from the described method, or appropriate results may be achieved even if replaced by other components or equivalents.

Therefore, other embodiments, other examples, and equivalents to the claims are within the scope of the following claims.

DESCRIPTION OF SYMBOLS

| | |
|---|---|
| 100: SYNAPSE DEVICE | 110: FIRST ELECTRODE |
| 111: ELECTRODE MATERIAL | 112: LITHIUM OXIDE LAYER |
| 120: ACTIVE LAYER | 121: POLYELECTROLYTE |
| 122: METAL NANOPARTICLES | 130: SECOND ELECTRODE |

What is claimed is:

1. A neuron behavior-imitating synapse device, comprising:
    a first electrode having a lithium-doped surface;
    an active layer formed on the first electrode and comprising a polyelectrolyte and one or more metal nanoparticles; and
    a second electrode formed on the active layer,
    wherein the metal nanoparticles are formed in at least one of a tetrahexahedron, a hexoctahedron, and a trisoctahedron, and have a diameter of 2 nm to 20 nm.

2. The neuron behavior-imitating synapse device according to claim 1, wherein the first electrode consists of an electrode material and a lithium oxide layer, wherein the lithium oxide layer is formed on the electrode material through surface treatment.

3. The neuron behavior-imitating synapse device according to claim 2, wherein a resistance of the active layer varies due to a change in a work function of at least one of the first and second electrodes by oxidation-reduction reaction in the lithium oxide layer.

4. The neuron behavior-imitating synapse device according to claim 1, wherein the polyelectrolyte comprises at least one of polyvinylpyrrolidone (PVP), polyethylene glycol (PEO), polyethyleneimine (PEI), polyethylene sulfide (PES), polyvinyl acetate (PVAc), and poly(ethylene succinate) (PESc).

5. The neuron behavior-imitating synapse device according to claim 1, wherein the metal nanoparticles comprise at least one of platinum (Pt), palladium (Pd), silver (Ag), and gold (Au).

6. A method of fabricating a neuron behavior-imitating synapse device, the method comprising:

forming a first electrode having a lithium-doped surface;

forming an active layer formed on the first electrode and comprising a polyelectrolyte and one or more metal nanoparticles; and forming a second electrode formed on the active layer, wherein the first electrode consists of an electrode material and a lithium oxide layer, wherein the lithium oxide layer is formed on the electrode material through surface treatment, and wherein the forming of the first electrode further comprises applying a lithium quinolate (Liq) layer onto an electrode material; and forming a lithium oxide layer on a surface of the lithium quinolate layer by heat-treating the lithium quinolate layer.

7. The method according to claim 6, wherein a resistance of the active layer varies due to a change in a work function of at least one of the first and second electrodes by oxidation-reduction reaction in the lithium oxide layer.

* * * * *